United States Patent
Cuffney et al.

(10) Patent No.: US 9,766,859 B2
(45) Date of Patent: *Sep. 19, 2017

(54) CHECKSUM ADDER

(71) Applicant: International Business Machines Corporation, Armonk, NY (US)

(72) Inventors: James R. Cuffney, Poughkeepsie, NY (US); John G. Rell, Jr., Saugerties, NY (US); Eric M. Schwarz, Gardiner, NY (US); Patrick M. West, Jr., Hyde Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/344,854

(22) Filed: Nov. 7, 2016

(65) Prior Publication Data

US 2017/0052763 A1   Feb. 23, 2017

Related U.S. Application Data

(63) Continuation of application No. 15/066,599, filed on Mar. 10, 2016, now Pat. No. 9,535,659, which is a continuation of application No. 14/211,383, filed on Mar. 14, 2014, now Pat. No. 9,436,434.

(51) Int. Cl.
| | |
|---|---|
| *G06F 11/10* | (2006.01) |
| *G06F 7/501* | (2006.01) |
| *G06F 7/50* | (2006.01) |
| *H03M 7/30* | (2006.01) |

(52) U.S. Cl.
CPC .............. *G06F 7/5016* (2013.01); *G06F 7/50* (2013.01); *H03M 7/30* (2013.01)

(58) Field of Classification Search
CPC ........................................................ G06F 11/104
USPC .......................... 714/807, 758, 766, 724, 704
See application file for complete search history.

(56) References Cited

U.S. PATENT DOCUMENTS

| | | | |
|---|---|---|---|
| 6,324,670 B1 | 11/2001 | Henriksen | |
| 7,206,994 B2 | 4/2007 | D'Arcy | |
| 2005/0149823 A1* | 7/2005 | Lee | H03M 13/096 |
| | | | 714/758 |
| 2007/0022225 A1* | 1/2007 | Nair | G06F 13/28 |
| | | | 710/22 |
| 2007/0162820 A1* | 7/2007 | Choi | H03M 13/091 |
| | | | 714/758 |
| 2010/0332949 A1* | 12/2010 | d'Abreu | G06F 11/1076 |
| | | | 714/766 |

\* cited by examiner

*Primary Examiner* — Fritz Alphonse
(74) *Attorney, Agent, or Firm* — Cantor Colburn LLP; Margaret A. McNamara

(57) ABSTRACT

Embodiments relate to a hardware circuit that is operable as a fixed point adder and a checksum adder. An aspect includes a driving of a multifunction compression tree disposed on a circuit path based on a control bit to execute one of first and second schemes of vector input addition and a driving of a multifunction adder disposed on the circuit path based on the control bit to perform the one of the first and second schemes of vector input addition.

1 Claim, 5 Drawing Sheets

CHECKSUM ADDER

This application is a continuation of U.S. application Ser. No. 15/066,599 filed Mar. 10, 2016, which is itself a continuation of U.S. application Ser. No. 14/211,383 filed Mar. 14, 2014. The entire disclosures of U.S. application Ser. No. 15/066,599 and U.S. application Ser. No. 14/211,383 are incorporated herein by reference.

BACKGROUND

The present invention relates generally to a checksum adder, and more specifically, to a hardware circuit that is operable as a fixed point adder and a checksum adder.

A checksum or hash sum is a small-size datum computed from an arbitrary block of digital data for the purpose of detecting errors that may have been introduced during its transmission or storage. The actual procedure that yields the checksum given a data input is called a checksum function or checksum algorithm and will usually output a significantly different value even for small changes made to the input. Due to this property, they may be used to detect many data corruption errors and verify overall data integrity. That is, if the computed checksum for the current data input matches the stored value of a previously computed checksum, there is a very high probability the data has not been accidentally altered or corrupted.

Checksum addition was discussed in U.S. Pat. No. 8,554,822, filed on Jun. 24, 2010, the entire contents of which are incorporated herein by reference. According to that disclosure, checksum binary code decimal (BCD) arithmetic add/subtract operations are performed on two BCD numbers independent of which BCD number is of a greater magnitude. Such operations are responsive to the BCD arithmetic add/subtract operation being a subtract operation and include performing a BCD arithmetic subtraction operation on a first BCD number and a second BCD number, the first BCD number having a first magnitude and the second BCD number having a second magnitude.

SUMMARY

Embodiments relate to a computer program product for implementing multiple functions. The computer program product includes a computer readable storage medium having program instructions embodied therewith. The computer readable storage medium is not a signal and the program instructions are readable by a processor to cause the processor to perform a method. The method includes driving, by the processor, a multifunction compression tree disposed on a circuit path and comprising n bit circuits arranged in a sequence, wherein n≥3, a lowest numbered bit circuit is $bit_0$ and a highest numbered bit circuit is $bit_{n-1}$ based on a control bit to execute one of fixed point vector input addition and checksum vector input addition. The driving, by the processor, of the multifunction compression tree includes receiving at a zeroth level compressor of each bit circuit an input of three vector inputs and outputting from the zeroth level compressor a zeroth level carryout and a zeroth level sum, receiving at a first level compressor of each bit circuit an input of two vector inputs and a first level carry-in derived from a zeroth level carry-out of an adjacent, higher numbered bit circuit and outputting from the first level compressor a first level carry-out and a first level sum, receiving at a second level compressor of each bit circuit an input of the zeroth level and first level sums and a second level carry-in derived from a first level carry-out of the adjacent, higher numbered bit circuit and outputting from the second level compressor a carry term and a sum term, ANDing the control bit along with the zeroth level carry-out in a first AND Gate disposed between lines respectively associated with the zeroth level carry-out of the $bit_0$ bit circuit and the first level carry-in of the $bit_{n-1}$ bit circuit and ANDing the control bit along with the first level carry-out in a second AND Gate disposed between lines respectively associated with the first level carry-out of the $bit_0$ bit circuit and the second level carry-in of the $bit_{n-1}$ bit circuit. The method further includes driving, by the processor, a multifunction adder disposed on the circuit path based on the control bit to perform the one of the fixed point vector input addition and checksum vector input addition, wherein the multifunction adder comprises a fixed point addition adder, a checksum addition adder disposed in parallel with the fixed point addition adder and a multiplexer controllable to generate as a result an output of either the fixed point addition adder or the checksum addition adder. The driving, by the processor, of the multifunction adder includes receiving an output of the multifunction compression tree at the fixed point addition adder and the checksum addition adder and controlling the multiplexer based on the control bit to generate as a result an output of either the fixed point addition adder or the checksum addition adder.

BRIEF DESCRIPTION OF THE SEVERAL VIEWS OF THE DRAWINGS

The subject matter which is regarded as embodiments is particularly pointed out and distinctly claimed in the claims at the conclusion of the specification. The forgoing and other features, and advantages of the embodiments are apparent from the following detailed description taken in conjunction with the accompanying drawings in which:

DETAILED DESCRIPTION

A high performance hardware implementation of a checksum adder is provided as part of a hardware circuit in a computing device. The circuit is capable of handling a plurality of inputs to produce a single output, thereby supporting a checksum algorithm. Further, area on a corresponding chip and power consumption are reduced as the circuit includes a multifunction compression tree that is used to support checksum operations as well as other addition functions, including for example vectorized fixed point addition.

Figure 1:
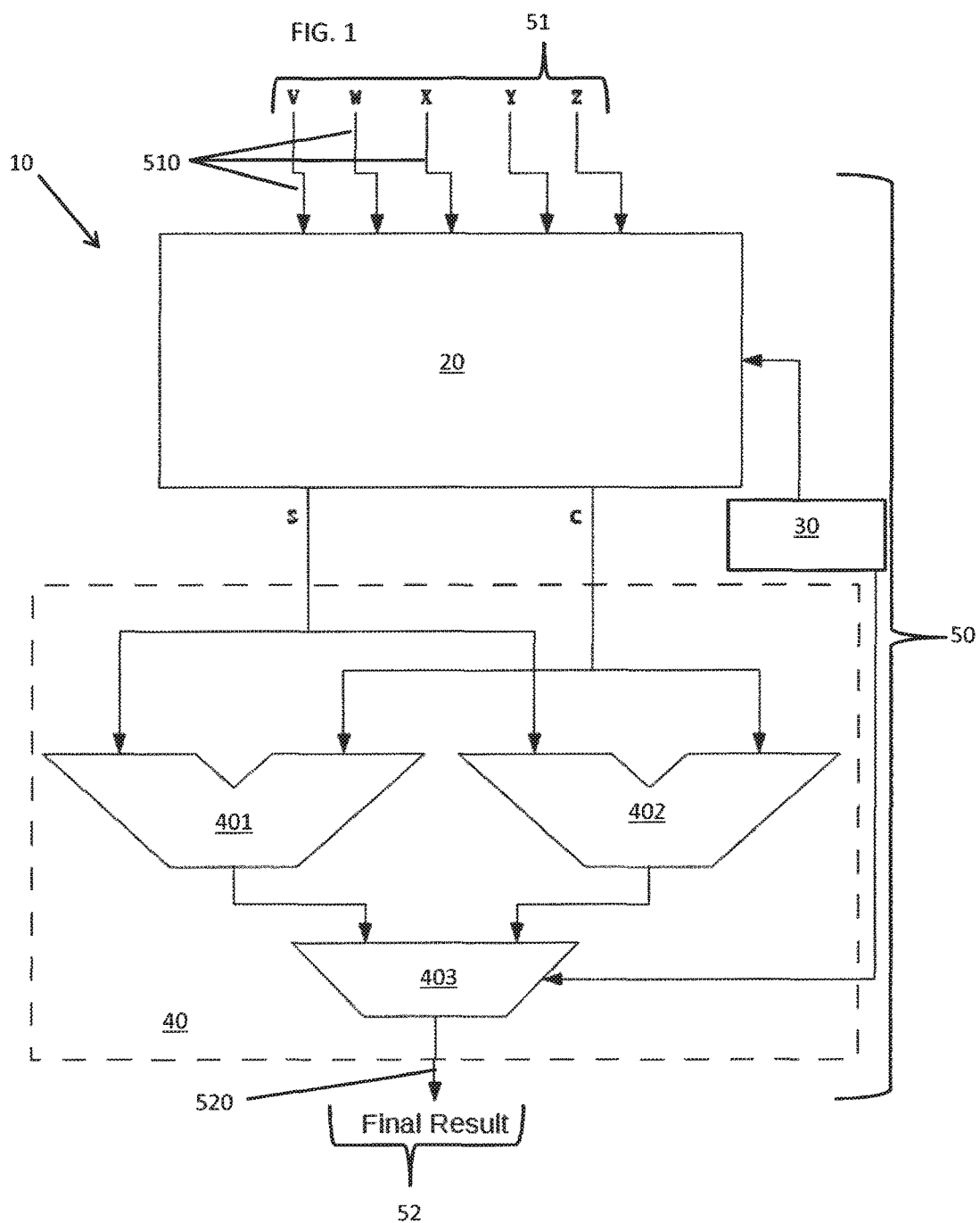
FIG. 1 depicts a circuit path including a multifunction compression tree and a fixed point/checksum adder in accordance with an embodiment.

Turning now to FIG. 1, a computing system 10 for executing multiple functions is generally shown. The computing system 10 includes a multifunction compression tree 20, a checksum operator 30 and a multifunction adder 40. The multifunction compression tree 20 is configured to execute one of first and second schemes of vector input addition and may be driven or controlled to execute either based on a nature of a control decode bit of the checksum operator 30. The multifunction compression tree 20 is disposed along a circuit path 50 having inputs 51 and an output 52. The multifunction adder 40 is configured to perform one of first and second schemes of vector input addition and may be driven or controlled to perform either in order to generate a result as the output 52 based on the nature of the control decode bit of the checksum operator 30. The multifunction adder 40 is disposed along the circuit path 50 downstream from and in signal communication with the multifunction compression tree 20.

The inputs 51 may include, in an exemplary embodiment, five separate inputs 510 whereas the output 52 includes a single output 520.

In accordance with embodiments, the first scheme of the vector input addition may include fixed point addition or vectorized fixed point addition. In accordance with additional or alternative embodiments, the second scheme of the vector input addition may include checksum addition. In any case, the control bit serves to signal the multifunction compression tree 20 as to whether fixed point addition or checksum addition is to be executed and further serves to signal the multifunction adder 40 as to whether fixed point addition or checksum addition is to be performed.

Figure 2:
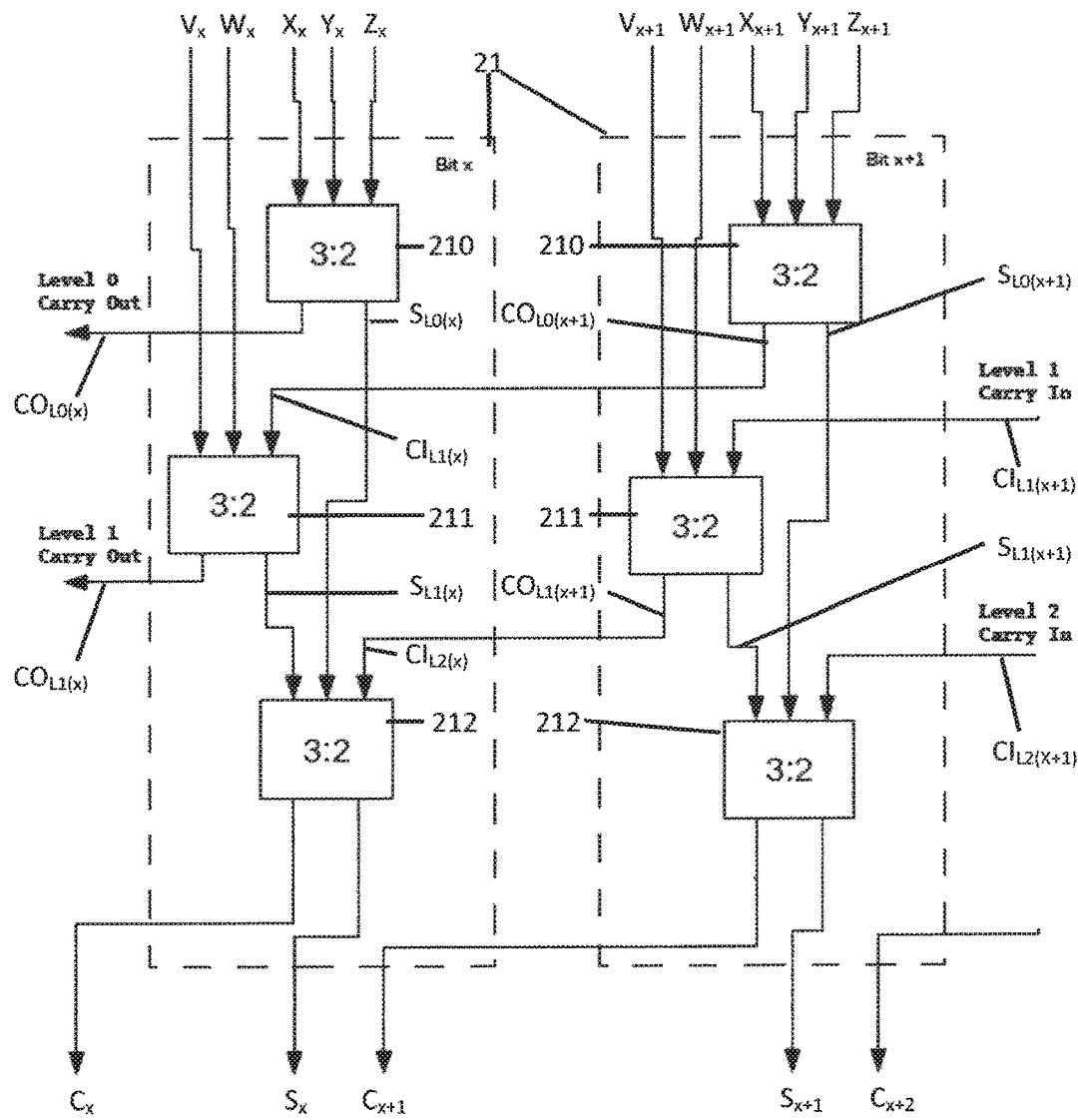
FIG. 2 depicts adjacent bits of the multifunction compression tree of FIG. 1 in accordance with an embodiment.
Figure 3:
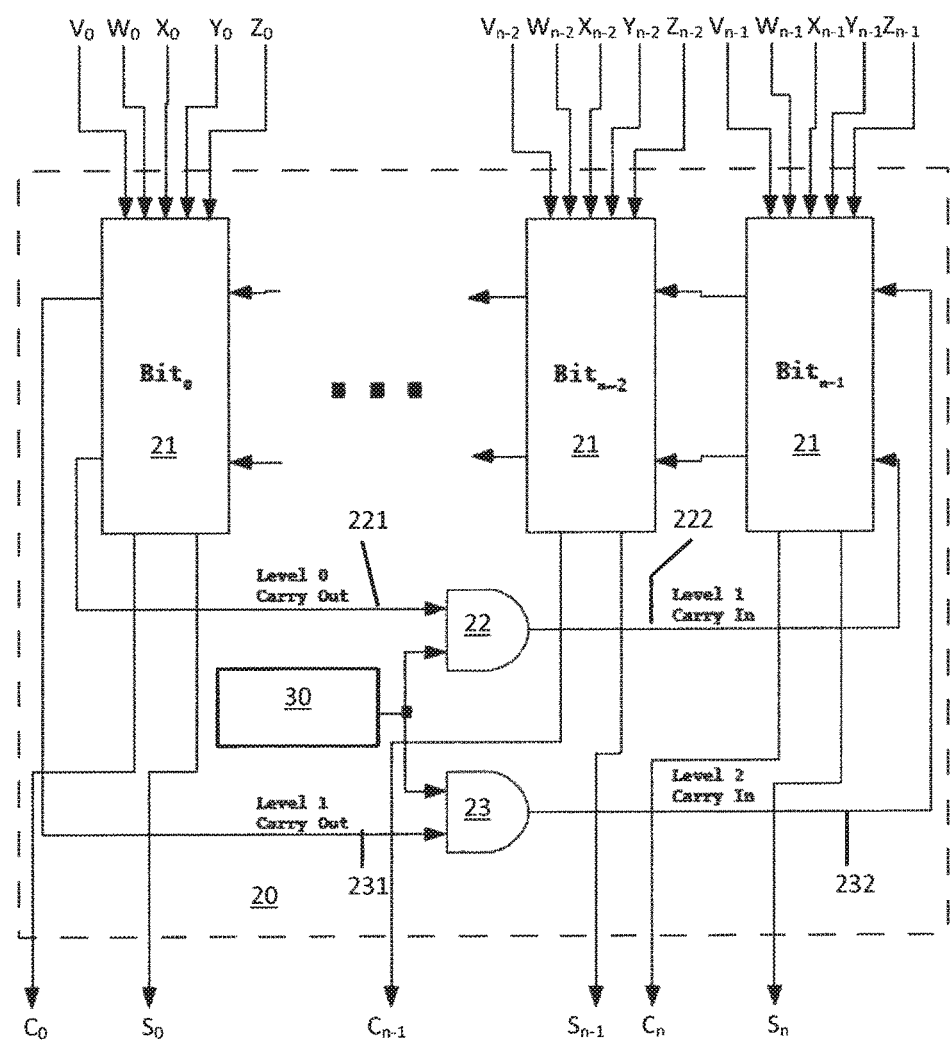
FIG. 3 is a schematic view of the multifunction compression tree of FIG. 1 in accordance with an embodiment.
Figure 4:
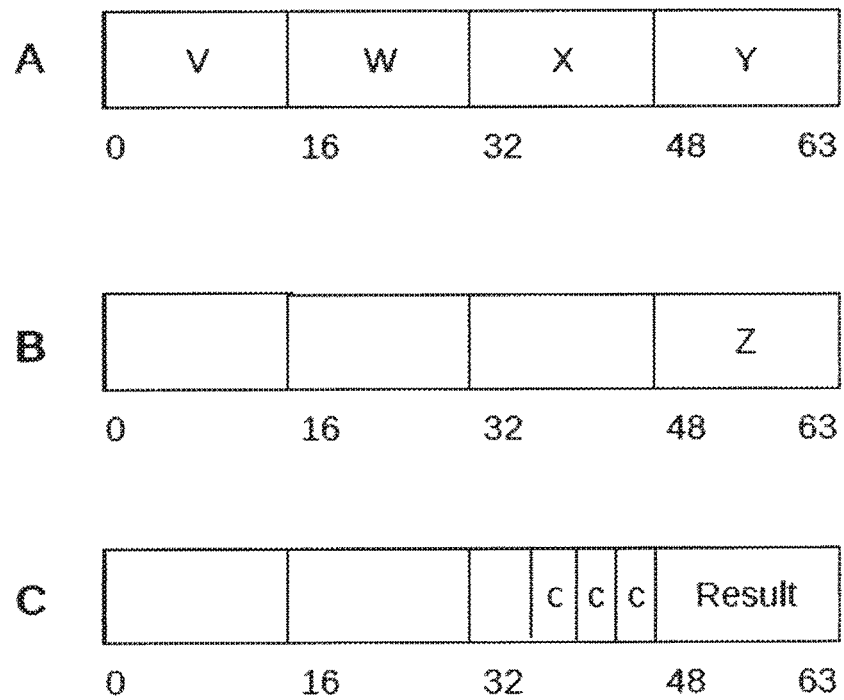
FIG. 4 depicts a process flow for Fixed Point addition in accordance with an embodiment.

With reference to FIGS. 2-4, the multifunction compression tree 20 includes a number n of bit circuits 21, which are arranged in a sequence. The number n may be equal to or greater than 3 and a lowest numbered bit circuit 21 is a $bit_0$ bit circuit 21 and a highest numbered bit circuit 21 is a $bit_{n-1}$ bit circuit 21. Each of the bit circuits 21 includes a first level compressor 210, which may be provided as a 3:2 compressor, a second level compressor 211, which may be provided as a 3:2 compressor, and a third level compressor 212, which may be provided as a 3:2 compressor.

The zeroth level compressor 210 of a given one of the bit circuits 21 (i.e., bit x) is configured to be receptive of three of the vector inputs of the five inputs 510 (i.e., vector inputs $X_x$, $Y_x$ and $Z_x$) and to generate as an output a zeroth level carryout $CO_{L0(x)}$ and a zeroth level sum bit $S_{L0(x)}$. The first level compressor 211 of the given one of the bit circuits 21 is configured to be receptive of an input of two of the vector inputs of the five inputs 510 (i.e., vector inputs $V_x$ and $W_x$) and a first level carry-in $CI_{L1(X)}$, which is derived from a zeroth level carry-out $CO_{L0(X+1)}$ of the adjacent, higher numbered bit circuit 21 (i.e., bit x+1). The first level compressor 211 is further configured to generate as an output a first level carry-out $CO_{L1(X)}$ and a first level sum bit $S_{L1(x)}$. The second level compressor 212 of the given one of the bit circuits 21 is configured to be receptive of an input of the zeroth level and first level sum bits $S_{L0(x)}$ and $S_{L1(x)}$ and a second level carry-in $CI_{L2(X)}$, which is derived from a first level carry-out $CO_{L1(X+1)}$ of the adjacent, higher numbered bit circuit 21. The second level compressor 212 is further configured to generate as an output a carry term $C_x$ and a sum term $S_x$. The five vector inputs of the five inputs 510 are all of equal length.

The second level compressor 212 of the adjacent higher numbered bit circuit 21 is similarly configured to generate as an output a carry term $C_{x+1}$ and a sum term $S_{x+1}$ from an input of the five vector inputs of the five inputs 510 (i.e., vector inputs $V_{x+1}$, $W_{x+1}$, $X_{x+1}$, $Y_{x+1}$ and $Z_{x+1}$). The second level compressor 212 of the next adjacent higher numbered bit circuit 21 (i.e., bit x+2) would be similarly configured to generate as an output a carry term $C_{x+2}$ and a sum term $S_{x+2}$.

As shown in FIG. 3, the multifunction compression tree 20 further includes a first AND Gate 22 and a second AND Gate 23. The first AND Gate 22 is disposed between lines 221 and 222, which are respectively associated with the zeroth level carry-out $CO_{L0}$ of the $bit_0$ bit circuit 21 and the first level carry-in $CI_{L1}$ of the $bit_{n-1}$ bit circuit 21. The second AND Gate 23 is disposed between lines 231 and 232, which are respectively associated with the first level carry-out $CO_{L1}$ of the $bit_0$ bit circuit 21 and the second level carry-in $CI_{L2}$ of the $bit_{n-1}$ bit circuit 21. The checksum operator 30 is coupled to the first AND Gate 22 and thereby ANDs the control decode bit with the zeroth level carry-out $CO_{L0}$ to generate as an output a first level carry-in $CI_{L1}$ 222. Similarly, the checksum operator 30 is coupled to the second AND Gate 23 and thereby ANDs the control decode bit with the first level carry-out $CO_{L1}$ to generate as an output a second level carry-in $CI_{L2}$ 232.

For fixed point addition, the control decode bit of the checksum operation signal is set to zero. Therefore, the first level carry-in $CI_{L1}$ of the $bit_{n-1}$ bit circuit 21 is driven to zero and, likewise, the second level carry-in $CI_{L2}$ of the $bit_{n-1}$ bit circuit 21 will also be driven to zero. However, for checksum addition, the control decode bit of the checksum operation signal is set to 1 and, therefore, the first level carry-in $CI_{L1}$ of the $bit_{n-1}$ bit circuit 21 is driven from the zeroth level carry-out $CO_{L0}$ of the $bit_0$ bit circuit 21. Likewise, the second level carry-in $CI_{L2}$ of the $bit_{n-1}$ bit circuit 21 will be driven by the first level carry-out $CO_{L1}$ of the $bit_0$ bit circuit 21. In this mode, the multifunction compression tree 20 performs the end around carry function.

As an example, the following equation is representative of the carry out, $C_{out}$, of the most significant bit of an input.

$$C_{out}=(A+B>=2^n)$$

Thus, based on the following algorithm, when the control decode bit serves as an indicator that the checksum operation signal is drive high, $C_{out}$ is fed back into the addition. Alternatively, when the control decode bit serves as an indicator that the checksum operation signal is zero, $C_{out}$ is not fed back into the addition.

```
if C_out = 1 {
    R = A+B+1
} else {
    R=A+B
```

With reference back to FIG. 1, the multifunction adder 40 includes a fixed point addition adder 401, a checksum addition adder 402 and a multiplexer 403. The checksum addition adder 402 is disposed in parallel with the fixed point addition adder 401 and the multiplexer 403 is controllable to generate as a result an output of either the fixed point addition adder 401 or the checksum addition adder 402. More particularly, a driving of the multifunction adder 40 includes configuring the multifunction adder 40 to receive an output of the multifunction compression tree 20 at the fixed point addition adder 401 and at the checksum addition adder 402 in parallel and controlling the multiplexer 403 based on the control decode bit to generate as a result an output of either the fixed point addition adder 401 (i.e., when the control decode bit is set to zero) or the checksum addition adder 402 (i.e., when the control decode bit is set to 1).

The first and second schemes of vector input addition respectively include fixed point addition and checksum addition and the control bit signals whether fixed point addition or checksum addition is to be executed and performed.

The multifunction compression tree includes n bit circuits arranged in a sequence, wherein n≥3, a lowest numbered bit circuit is bit0 and a highest numbered bit circuit is bitn−1. The driving of the multifunction compression tree includes receiving at a zeroth level compressor of each bit circuit an input of three vector inputs and outputting from the zeroth level compressor a zeroth level carryout and a zeroth level sum bit, receiving at a first level compressor of each bit circuit an input of two vector inputs and a first level carry-in derived from a zeroth level carry-out of an adjacent, higher numbered bit circuit and outputting from the first level compressor a first level carry-out and a first level sum bit and receiving at a second level compressor of each bit circuit an input of the zeroth level and first level sum bits and a second level carry-in derived from a first level carry-out of the adjacent, higher numbered bit circuit and outputting from the second level compressor a carry term and a sum term.

The driving of the multifunction compression tree further includes ANDing the control bit along with the zeroth level carry-out as an input to a first AND Gate disposed between lines respectively associated with the zeroth level carry-out of the bit0 bit circuit and the first level carry-in of the bitn−1 bit circuit and ANDing the control bit along with the first level carry-out as an input to a second AND Gate disposed between lines respectively associated with the first level carry-out of the bit0 bit circuit and the second level carry-in of the bitn−1 bit circuit.

The multifunction adder includes a fixed point addition adder, a checksum addition adder disposed in parallel with the fixed point addition adder, and a multiplexer controllable to generate as a result an output of either the fixed point addition adder or the checksum addition adder. The driving of the multifunction adder includes receiving an output of the multifunction compression tree at the fixed point addition adder and the checksum addition adder and controlling the multiplexer based on the control bit to generate as a result an output of either the fixed point addition adder or the checksum addition adder.

Technical effects and benefits include area and power consumption reduction for a given hardware element by integrating a checksum adder and a vector fixed point adder onto the same given hardware element.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Figure 5:
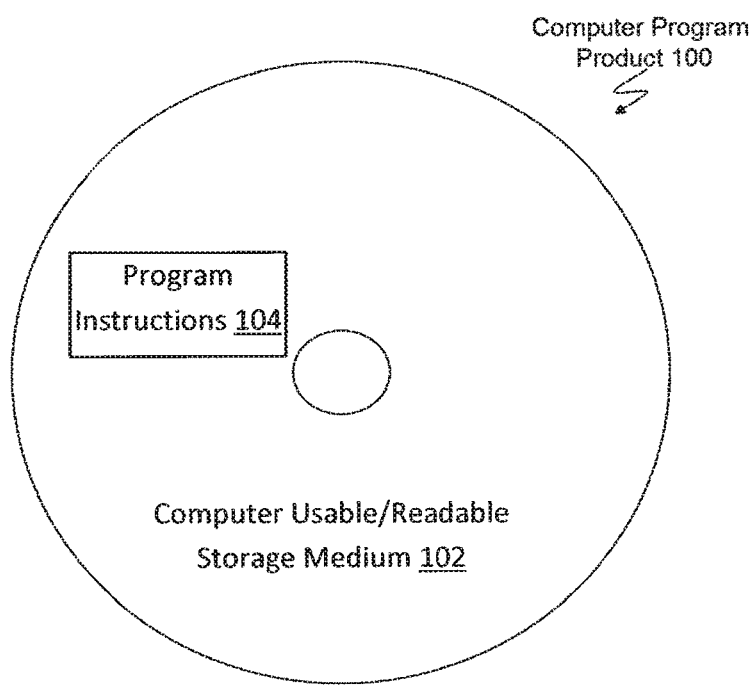
FIG. 5 depicts a computer-readable medium according to an embodiment.

Referring now to FIG. 5, in one example, a computer program product 100 in accordance with an embodiment that includes a computer readable storage medium 102 and program instructions 104 is generally shown.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer program product for implementing multiple functions, the computer program product comprising:
   a computer readable storage medium having program instructions embodied therewith, wherein the computer readable storage medium is not a signal, the program instructions readable by a processor to cause the processor to perform a method comprising:
   driving, by the processor, a multifunction compression tree disposed on a circuit path and comprising n bit circuits arranged in a sequence, wherein n≥3, a lowest numbered bit circuit is $bit_0$ and a highest numbered bit circuit is $bit_{n-1}$ based on a control bit to execute one of fixed point vector input addition and checksum vector input addition, wherein the driving, by the processor, of the multifunction compression tree comprises:
   receiving, at a zeroth level compressor of each bit circuit, an input of three vector inputs and outputting, from the zeroth level compressor, a zeroth level carryout and a zeroth level sum;
   receiving, at a first level compressor of each bit circuit, an input of two vector inputs and a first level carry-in that is derived from a zeroth level carry-out of an adjacent, higher numbered bit circuit and outputting, from the first level compressor, a first level carry-out and a first level sum;
   receiving, at a second level compressor of each bit circuit, an input of the zeroth level and first level sums and a second level carry-in that is derived from a first level carry-out of the adjacent, higher numbered bit circuit and outputting, from the second level compressor a carry term and a sum term;
   ANDing the control bit along with the zeroth level carry-out in a first AND Gate disposed between lines respectively associated with the zeroth level carry-out of the $bit_0$ bit circuit and the first level carry-in of the $bit_{n-1}$ bit circuit; and
   ANDing the control bit along with the first level carry-out in a second AND Gate disposed between lines respectively associated with the first level carry-out of the $bit_0$ bit circuit and the second level carry-in of the $bit_{n-1}$ bit circuit; and
   driving, by the processor, a multifunction adder disposed on the circuit path based on the control bit to perform the one of the fixed point vector input addition and checksum vector input addition, wherein the multifunction adder comprises a fixed point addition adder, a checksum addition adder disposed in parallel with the fixed point addition adder and a multiplexer controllable to generate as a result an output of either the fixed point addition adder or the checksum addition adder, and
   the driving, by the processor, of the multifunction adder comprises receiving an output of the multifunction compression tree at the fixed point addition adder and the checksum addition adder and controlling the multiplexer based on the control bit to generate as a result an output of either the fixed point addition adder or the checksum addition adder.

* * * * *